(12) United States Patent
Melanson

(10) Patent No.: US 7,081,843 B2
(45) Date of Patent: Jul. 25, 2006

(54) OVERLOAD PROTECTION FOR LOOK-AHEAD DELTA SIGMA MODULATORS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/090,372

(22) Filed: Mar. 25, 2005

(65) Prior Publication Data

US 2006/0012500 A1    Jan. 19, 2006

Related U.S. Application Data

(60) Provisional application No. 60/588,951, filed on Jul. 19, 2004.

(51) Int. Cl.
*H03M 3/00* (2006.01)
(52) U.S. Cl. .................................................. 341/143
(58) Field of Classification Search ........ 341/143–144, 341/155
See application file for complete search history.

(56) References Cited

U.S. PATENT DOCUMENTS

| | | | |
|---|---|---|---|
| 5,548,286 A | 8/1996 | Craven | 341/144 |
| 5,550,544 A | 8/1996 | Sakiyama et al. | 341/155 |
| 5,598,159 A | 1/1997 | Hein | 341/143 |
| 5,708,433 A | 1/1998 | Craven | 341/144 |
| 5,742,246 A * | 4/1998 | Kuo et al. | 341/143 |
| 5,757,300 A | 5/1998 | Koilpillai et al. | 341/143 |
| 5,757,517 A | 5/1998 | Couwenhoven et al. | 358/463 |
| 5,786,779 A | 7/1998 | Chun et al. | 341/61 |
| 5,977,899 A | 11/1999 | Adams et al. | 341/145 |
| 6,112,218 A | 8/2000 | Gandhi et al. | 708/320 |
| 6,160,505 A | 12/2000 | Vaishampayan | 341/143 |
| 6,177,897 B1 | 1/2001 | Williams, III | 341/150 |
| 6,232,899 B1 | 5/2001 | Craven | 341/126 |
| 6,310,518 B1 | 10/2001 | Swanson | 330/282 |

(Continued)

FOREIGN PATENT DOCUMENTS

EP    1227595    7/2002

(Continued)

OTHER PUBLICATIONS

Zetterberg, L.H. et al., "Adaptive Delta Modulation with Delayed Decision," IEEE Transactions on Communications, IEEE vol. COM-22, No. 9, Sep. 1974, pp. 1195-1198.

(Continued)

*Primary Examiner*—Rexford Barnie
*Assistant Examiner*—Khai Nguyen
(74) *Attorney, Agent, or Firm*—Hamilton & Terrile, LLP; Kent B. Chambers

(57) ABSTRACT

Look-ahead delta sigma modulators of the signal processing systems described herein can anticipate quantizer overload. By anticipating quantizer overload, the look-ahead delta sigma modulators can select an output value y(n) that may have a lower SNR but will prevent quantizer overload in the future. A quantizer overload protection process determines the amount of look-ahead depth to drive state variables of a loop filter of the look-ahead delta sigma modulator to values that would prevent future quantizer overload. By substituting a quantizer of the look-ahead delta sigma modulator with a gain and determining a closed loop impulse response of a look-ahead delta-sigma modulator, the discrete time to achieve an absolute value maximum closed loop response magnitude of the look-ahead delta-sigma modulator has been determined to be directly related to the look-ahead depth that will prevent future quantizer overload.

40 Claims, 9 Drawing Sheets

U.S. PATENT DOCUMENTS

| | | | |
|---|---|---|---|
| 6,313,773 B1 | 11/2001 | Wilson et al. | 341/143 |
| 6,362,769 B1 | 3/2002 | Hovin et al. | 341/157 |
| 6,373,416 B1 | 4/2002 | McGrath | 341/143 |
| 6,480,129 B1 | 11/2002 | Melanson | 341/143 |
| 6,480,528 B1 | 11/2002 | Patel et al. | 375/148 |
| 6,501,404 B1 | 12/2002 | Walker | 341/143 |
| 6,639,531 B1 | 10/2003 | Melanson | 341/143 |
| 6,724,332 B1 | 4/2004 | Melanson | 341/143 |
| 6,760,573 B1 | 7/2004 | Subrahmanya et al. | 455/192.2 |
| 6,822,594 B1 | 11/2004 | Melanson et al. | 341/143 |
| 6,842,128 B1 | 1/2005 | Koh | 341/143 |
| 6,842,486 B1 | 1/2005 | Plisch et al. | 375/247 |
| 6,861,968 B1 | 3/2005 | Melanson | 341/143 |
| 6,873,278 B1 | 3/2005 | Ferguson et al. | 341/144 |
| 6,873,280 B1 | 3/2005 | Robinson et al. | 341/159 |
| 6,879,275 B1 | 4/2005 | Melanson | 341/143 |
| 6,888,484 B1 | 5/2005 | Kiss et al. | 341/143 |
| 6,933,871 B1 | 8/2005 | Melanson et al. | 341/143 |
| 2003/0086366 A1 | 5/2003 | Branlund et al. | 370/208 |
| 2003/0231729 A1 | 12/2003 | Chien et al. | 375/376 |
| 2005/0012649 A1 | 1/2005 | Adams et al. | 341/143 |
| 2005/0052300 A1 | 3/2005 | Ranganathan | 341/143 |

FOREIGN PATENT DOCUMENTS

| | | |
|---|---|---|
| JP | 2003-124812 | 4/2003 |

OTHER PUBLICATIONS

Stonick, J.T. et al., "Look-Ahead Decision-Feedback Σ Δ Modulation," IEEE International Conference on Acoustics, Speech and Signal Processing, New York, 1994, (pp. III 541-III 544).

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of $3^{rd}$ Order Sigma-Delta Modulators via FPGA Implementation," ASIC/SOC Conference, 2001, Proceedings, $14^{th}$ Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6.

Lindfors, S., "A Two-Step Quantization Δ Σ-Modulator Architecture with Cascaded Digital Noise Cancellation," Electronics, Circuits and Systems, 2000, ICECS, The $7^{th}$ IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conferences on Acoustic, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-Jun. 3, 1998, vol. 1, pp. 583-586.

Angus, James A.S., "Tree Based Lookahead Sigma Delta Modulators," Audio Engineering Society $114^{th}$ Convention, Convention Paper 5825, Mar. 22-25, 2003.

Harpe, Pieter, et al., "Efficient Trellis-Type Sigma Delta Modulator," Audio Engineering $114^{th}$ Convention, Convention Paper 5845, Mar. 22-25, 2003.

Hawksford, M.O.J., "Parametrically Controlled Noise Shaping in Variable State-Step-Back Pseudo-Trellis SDM," Audio Engineering Society $115^{th}$ Convention, Convention Paper, Oct. 10-13, 2003.

Kato, Hiroshi, "Trellis Noise-Shaping Converters and 1-bit Digital Audio," Audio Engineering Society $112^{th}$ Convention, Convention Paper 5615, May 10-13, 2002.

Sony Electronics, Inc. and Philips Electronics N.V., "Super Audio Compact Disc, A Technical Proposal," 1997, (12 pages).

J. Paulos et al., "Improved Signal-To-Noise Ratio Using Tri-Level Delta-Sigma Modulation," Reprinted from IEEE Proc. ISCAS, May 1987, pp. 245-248.

E. Knapen et al., "Lossless Compression of 1-Bit Audio," J. Audio Eng. Soc., vol. 52, No. 3, Mar. 2004, pp. 190-199.

\* cited by examiner

OVERLOAD PROTECTION FOR LOOK-AHEAD DELTA SIGMA MODULATORS

CROSS-REFERENCE TO RELATED APPLICATION

This application claims the benefit under 35 U.S.C. § 119(e) of U.S. Provisional Application No. 60/588,951, filed Jul. 19, 2004 and entitled "Signal Processing Systems with Look-Ahead Delta-Sigma Modulators". Provisional Application No. 60/588,951 includes exemplary systems and methods and is incorporated by reference in its entirety.

BACKGROUND OF THE INVENTION

1. Field of the Invention

The present invention relates in general to the field of information processing, and more specifically to a system and method for protecting overload of look-ahead delta sigma modulators using overload anticipation technology.

2. Description of the Related Art

Many signal processing systems include delta sigma modulators to quantize an input signal into one or more bits. Delta sigma modulators trade-off increased noise in the form of quantization error in exchange for high sample rates and noise shaping. Delta-sigma modulators are particularly useful for modulating low frequency signal, such as audio signal, because delta-sigma modulators include a noise shaping loop filter that includes a noise transfer function ("NTF") that modulates a significant amount of noise out of an audio signal baseband. An audio signal baseband is approximately zero (0) Hz to twenty-five (25) kHz. In-band noise decreases as oversampling of input signal sample x(n) increases. Higher order loop filters also decrease in-band noise. "Delta-sigma modulators" are also commonly referred to using other interchangeable terms such as "sigma-delta modulators", "delta-sigma converters", "sigma delta converters", and "noise shapers".

FIG. 1 depicts a delta-sigma modulator 100 that receives an input signal sample x(n), determines a difference between x(n) and the delayed output signal y(n−1), processes the difference signal with a noise shaping loop filter 102, and quantizes the filter 102 output with quantizer 104 to provide output signal y(n). The quantizer 104 can provide multi-bit or one-bit quantization. The quantizer step size, A, represents the difference between each quantization level. One-bit quantizers have only two quantization levels specified as $\{-\Delta/2, \Delta/2\}$ or $\{-1,1\}$. Shreier and Temes, Understanding Delta-Sigma Signal Converters, IEEE Press, 2005 describes conventional delta-sigma modulators in more detail.

Delta-sigma modulators, especially delta-sigma modulators with 1-bit quantizers, are prone to overload. Quantizer overload generally occurs when a quantizer 104 receives an input signal that is either excessively high or low. Quantizer input signals that exceeds the upper and lower quantization levels of quantizer 104 will cause quantizer 104 to overload. Additionally, multi-order (i.e. delta-sigma modulators with multi-order loop filters) delta-sigma modulator systems exhibit an increasingly lower tolerance to an input signal that does not exceed yet approaches the upper and lower quantization levels of the quantizer. Quantizer overload causes state variables of loop filter 102 to grow without bound, and, thus, the delta-sigma modulator output signal y(n) will no longer represent input signal sample x(n). Quantizer overload causes many undesirable effects. In audio systems, quantizer overload can result in instability and cause oscillations resulting in undesirable, audible tones. Quantizer overload can also cause abrupt signal magnitude and frequency changes, which also result in undesirable noise.

Quantizer overload is more likely to occur when the input signal x(n) is large relative to the full scale feedback signal y(n−1) because the negative feedback of signal y(n−1) will be unable to compensate for the large value of input signal x(n). A "modulation index" ("MI") is defined as the ratio of the maximum input signal x(n) to the maximum feedback signal (max(x(n))/max(y(n−1))). Designers of one-bit delta-sigma modulators generally attempt to limit the MI of one-bit delta-sigma modulators to 0.5. In other terms, a delta-sigma modulator input signal sample x(n) that produces 75%+1 outputs y(n) and 25%−1 outputs y(n) would have a modulation index of 0.5 or 50% (75%−25%=50%).

Some applications specify a full-scale input signal by the MI. For example, the super audio compact disk ("SACD") specification defines a full-scale input signal as one having a modulation index of 50%. However, it is desirable to handle larger input signals, such as transient signals, without overloading the delta-sigma modulator.

Higher order loop filters and more aggressive noise shaping also increase the susceptibility of delta-sigma modulators to quantizer overload. FIG. 2 depicts a noise versus frequency plot 300 for a conventional delta sigma modulator. At the upper baseband frequency, $f_B$, the NTF of the delta sigma modulator effectively lowers the noise magnitude, thus increasing the signal-to-noise ratio ("SNR"). However, as noise in the baseband is further suppressed, noise magnitudes outside the baseband continue to increase. Thus, more aggressive noise shaping can result in larger signals and increase the probability of quantizer overload. The steepness of the noise versus frequency plot 300 outside of the baseband is directly related to the noise shaping gain of delta sigma modulator loop filter.

The susceptibility to quantizer overload represents a key design constraint in the design of delta-sigma modulators. High MI and high SNR both run counter to good delta sigma modulator stability.

Look-ahead delta sigma modulators have been shown to improve quantizer overload performance and allow for more aggressive noise shaping. FIG. 3 depicts a look-ahead delta sigma modulator 300 having a depth of N. The depth N refers to the number of sequential samples that are processed by look-ahead delta sigma modulator 300 to determine a single output y(n). $X(N)_t$ represents a vector for time t whose elements are the N input samples used to determine a single output y(n), $X(N)_t = \{x(n), x(n+1), \ldots, x(n+N-1)\}_t$ for time t. The Look-ahead/Actual Output 'Switch' is a functional representation indicating that during look-ahead operations, each output candidate vectors $Y_i$ is provided as simulated feedback data, $Y = \{y(n-1), y(n-2), \ldots, y(n-N-1)\}$. "i" represents the number of possible output candidate vectors. For a one-bit delta sigma modulator, each element of the output candidate vector can be a logical −1 or +1. Thus, for an N element vector, there are $2^N$ possible combinations of vectors, and $i=2^N$. For each time t, the state variables of P-order loop filter 306 from the previous, actual quantization operation are saved. The saved state variables are used as the initial state variables each time the look-ahead delta sigma modulator 300 sequentially quantizes each element of input signal vector $X(N)_t$ using each element of the $i^{th}$ output candidate vector $Y_i$ as sequential feedback. The P-order loop filter 306 has an order of P and filter coefficients $c_0, c_1, \ldots, c_{P-1}$. The order and filter coefficient values are a matter of design choice and are generally chosen with regard to the NTF, signal transfer function ("STF"), SNR, and stability.

After processing each input signal vector $X(N)_t$ and each set of output candidate vectors $Y_i$, the quantizer 304 determines which output candidate vector $Y_i$ represents the best match with the input signal vector $X(N)_t$. The best match output candidate vector is referred to as the best match output candidate vector $Y_{bestm}$. One embodiment of a "best match" is described by Hiroshi Kato, "Trellis Noise-Shaping Converters and 1-bit Digital Audio," AES 112th Convention, May 10–13, 2002 Munich, as the match having the lowest cost in terms of root mean square ("RMS") power. Conventional research in look-ahead modulators primarily involves two threads. Additional conventional look-ahead delta sigma modulator information can be found in Hiroshi Kato, Japanese Patent JP, 2003-124812 A, Harpe, P., Reefman D., Janssen E., "Efficient Trellis-type Sigma Delta Modulator," AES 114th Convention, Mar. 22–25, 2003 Amsterdam (referred to herein as "Harpe"); James A. S. Angus, "Tree Based Look-ahead Sigma Delta Modulators," AES 114th Convention, Mar. 22–25, 2003 Amsterdam; James A.S. Angus, "Efficient Algorithms for Look-Ahead Sigma-Delta Modulators," AES 155th Convention, Oct. 10–13, 2003 New York; and Janssen B., Reefman D., "Advances in Trellis based SDM structures," AES 115th Convention, Oct. 10–13, 2003 New York.

The actual output y(n) is chosen as the leading bit of the output candidate vector $Y_i$ determined to be the best match. The Look-ahead/Actual Output Switch 302 then feeds back the chosen output delayed by one unit of time y(n−1) to update the state variables of P-order loop filter 306 with actual state variables.

Computation and storage requirements conventionally grow exponentially with increases in the look-ahead depth. Schemes have been developed to prune trellis-type look-ahead delta sigma modulators, but pruning can miss the most important paths for overload protection. Thus, look-ahead delta sigma modulators continue to be subject to quantizer overload.

SUMMARY OF THE INVENTION

In one embodiment of the present invention, a method of anticipating quantizer overload of a look-ahead delta sigma modulator includes determining a likelihood of quantizer overload of the look-ahead delta sigma modulator from a closed loop response of the look-ahead delta-sigma modulator to a closed loop feedback signal. The look-ahead delta-sigma modulator includes a gain stage substitute for a quantizer.

In another embodiment of the present invention, a signal processing system includes a look-ahead delta-sigma modulator with overload protection. The look-ahead delta-sigma modulator includes an overload protection module to determine a likelihood of quantizer overload of the look-ahead delta sigma modulator from a closed loop response of the look-ahead delta-sigma modulator to a closed loop feedback signal. The look-ahead delta-sigma modulator includes a gain stage substitute for a quantizer.

In another embodiment of the present invention, a method of quantizing an input signal using a look-ahead delta-sigma modulator having quantizer overload protection, wherein a look-ahead depth of the look-ahead delta sigma modulator equals n1, and n1 is a positive integer, includes determining a set of state variables for a loop filter of the look-ahead delta sigma modulator for at least n1 elements of an input signal vector X(n) and at least n1 elements of each output candidate vector Y(n)i. "i" is an element of at least a subset of the set $\{0, 1, \ldots, 2^{n1-1}\}$, n1 is a positive integer greater than one, and the n1 elements of input signal vector X(n) represent n1 input signal samples. The method also includes substituting a quantizer of the look-ahead delta sigma modulator with a gain stage to provide a closed loop feedback path in the look-ahead delta sigma modulator. The method further includes determining closed loop output responses of the look-ahead delta sigma modulator for n2 input samples using at least one set of determined state variables, wherein n2 represents a number of input samples to anticipate quantizer overload of the look-ahead delta sigma modulator. The method also includes determining which closed loop output response has a lowest maximum absolute value closed loop output response. If overload of the look-ahead delta-sigma modulator is anticipated, the method also includes selecting an output of the look-ahead delta sigma modulator from the output candidate vector corresponding to the determined closed loop output response having the lowest maximum absolute value closed loop output response.

In a further embodiment of the present invention, a signal processing system to quantize an input signal using a look-ahead delta-sigma modulator with quantizer overload protection includes an input to receive an input signal vector X(n), wherein the input signal vector X(n) has n1 elements and n1 is a positive integer greater than one and equals a look-ahead depth of the look-ahead delta-sigma modulator. A look-ahead depth of the look-ahead delta sigma modulator equals n1, and n1 is a positive integer. The system also includes a loop filter coupled to the input, a quantizer coupled to the loop filter, and a gain module coupled to the loop filter, and a memory to store a set of state variables for the loop filter of the look-ahead delta sigma modulator for at least n1 elements of an input signal vector X(n) and at least n1 elements of each output candidate vector Y(n)i, wherein "i" is an element of at least a subset of the set $\{0, 1, \ldots, 2^{n1-1}\}$, n1 is a positive integer greater than one, and the n1 elements of input signal vector X(n) represent n1 input signal samples. The overload protection module is configured to substitute the quantizer with the gain stage to provide a closed loop feedback path in the look-ahead delta sigma modulator and determine closed loop output responses of the look-ahead delta sigma modulator for n2 input samples using at least one set of determined state variables. "n2" represents a number of input samples to anticipate overload of the quantizer. The overload protection module is further configured to determine which closed loop output response has a lowest maximum absolute value closed loop output response and if overload of the look-ahead delta-sigma modulator is anticipated, select an output of the look-ahead delta sigma modulator from the output candidate vector corresponding to the determined closed loop output response having the lowest maximum absolute value closed loop output response.

In another embodiment of the present invention, an apparatus to quantize an input signal using a look-ahead delta-sigma modulator with quantizer overload protection, wherein a look-ahead depth of the look-ahead delta sigma modulator equals n1, and n1 is a positive integer, includes means for determining a set of state variables for a loop filter of the look-ahead delta sigma modulator for at least n1 elements of an input signal vector X(n) and at least n1 elements of each output candidate vector Y(n)i. "i" is an element of at least a subset of the set $\{0, 1, \ldots, 2n1-1\}$, n1 is a positive integer greater than one, and the n1 elements of input signal vector X(n) represent n1 input signal samples.

The apparatus further includes means for substituting a quantizer of the look-ahead delta sigma modulator with a gain stage to provide a closed loop feedback path in the look-ahead delta sigma modulator. The apparatus also includes means for determining closed loop output responses of the look-ahead delta-sigma modulator for n2 input samples using at least one set of determined state variables, wherein n2 represents a number of input samples to anticipate quantizer overload of the look-ahead delta sigma modulator. The apparatus further includes means for determining which closed loop output response has a lowest maximum absolute value closed loop output response and means for selecting an output of the look-ahead delta sigma modulator from the output candidate vector corresponding to the determined closed loop output response having the lowest maximum absolute value closed loop output response if overload of the look-ahead delta-sigma modulator is anticipated.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
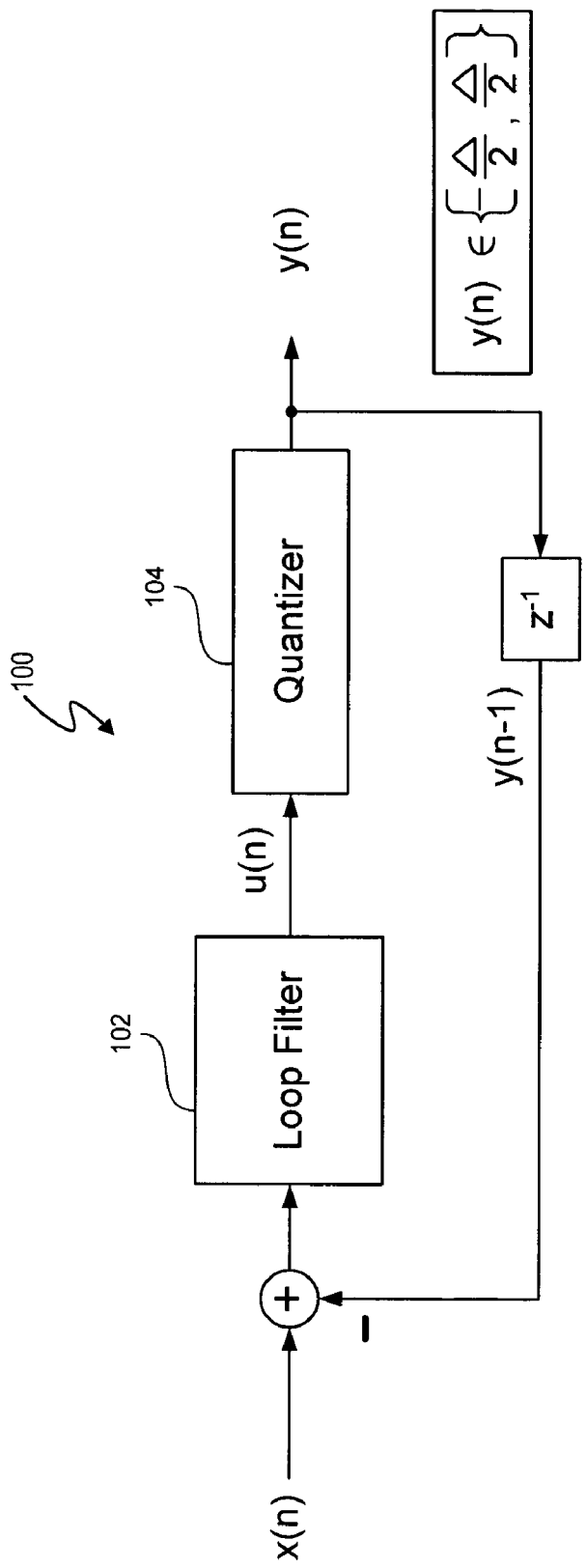
FIG. 1 (labeled prior art) depicts a delta sigma modulator.
Figure 2:
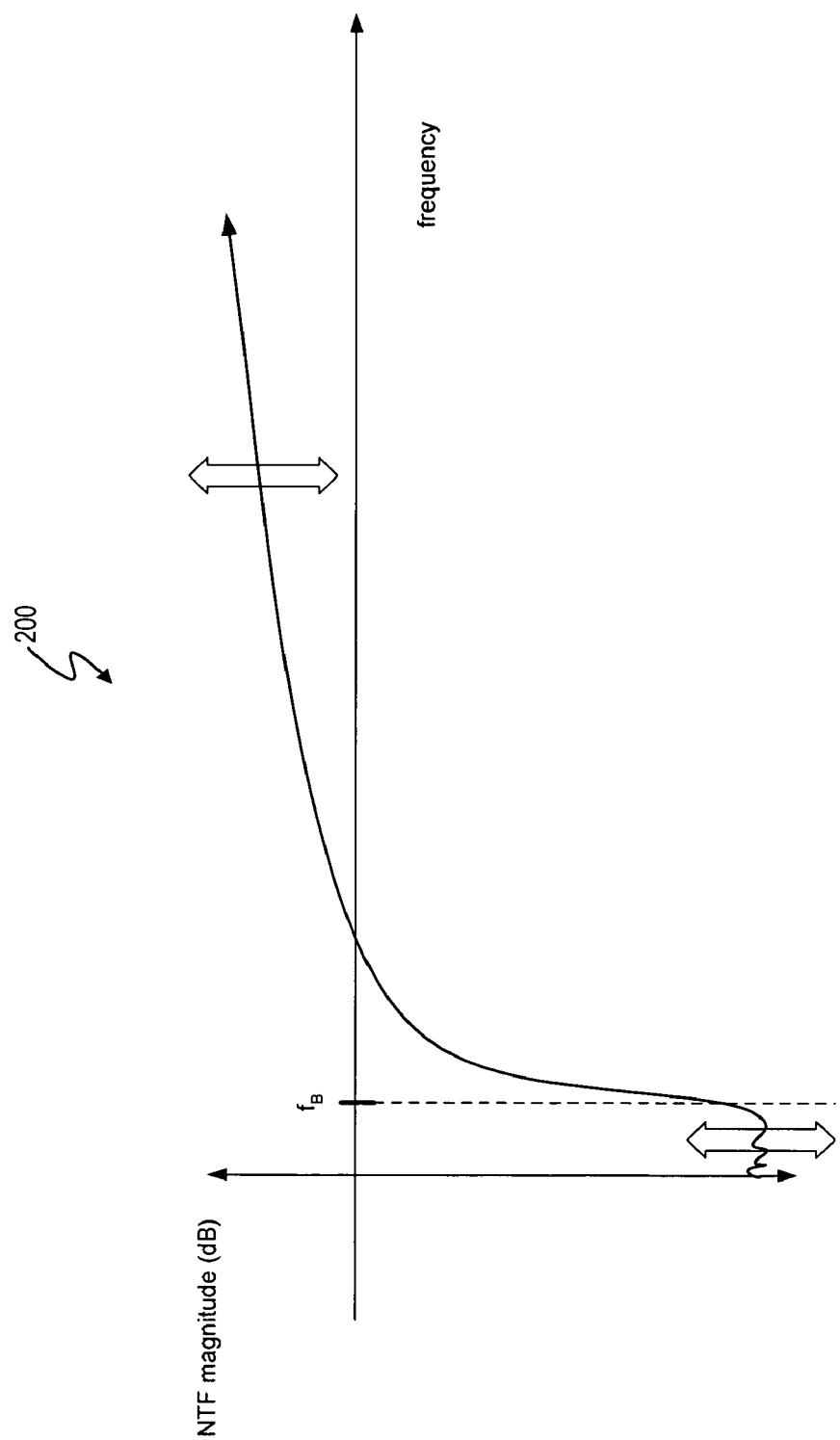
FIG. 2 (labeled prior art) depicts a noise versus frequency plot for a conventional delta sigma modulator.
Figure 3:
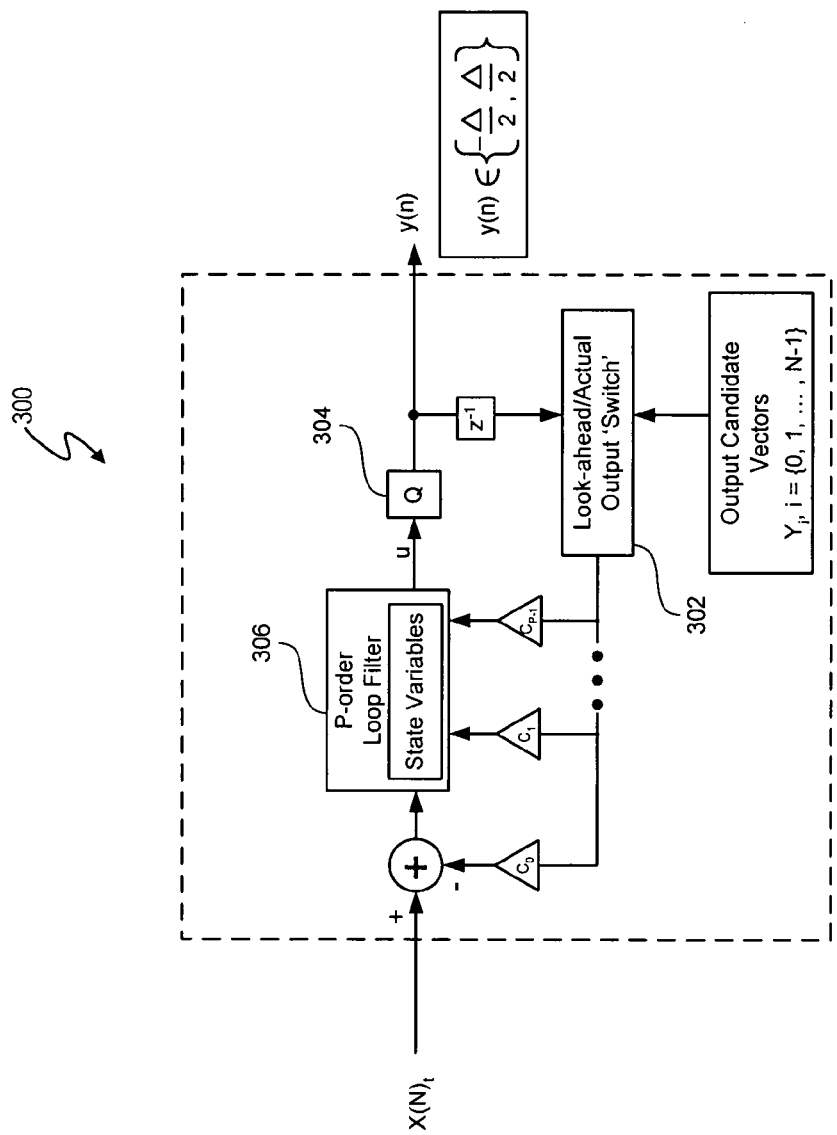
FIG. 3 (labeled prior art) depicts a look-ahead delta sigma modulator.

Look-ahead delta sigma modulators of the signal processing systems described herein can anticipate quantizer overload. By anticipating quantizer overload, the look-ahead delta sigma modulators can select an output value y(n) that may have a lower SNR but will prevent quantizer overload in the future. A quantizer overload protection process determines the amount of look-ahead depth to drive state variables of a loop filter of the look-ahead delta sigma modulator to values that would prevent future quantizer overload. By temporarily substituting a quantizer of the look-ahead delta sigma modulator with a gain stage to determine a closed loop impulse response of a look-ahead delta-sigma modulator, the discrete time to achieve an absolute value maximum closed loop response magnitude ("MCL") of the look-ahead delta-sigma modulator has been determined to be directly related to the look-ahead depth that will prevent future quantizer overload. The time to reach the MCL ("MCLt") is inversely proportional to the noise shaping gain illustrated by the linear-linear scale slope of the look-ahead delta sigma modulator NTF, which in-turn corresponds with stability of the look-ahead delta sigma modulator. Thus, the look-ahead depth used to anticipate quantizer overload is directly related to noise shaping gain and filter order.

The root cause of quantizer overload induced instability resides with the quantizer of a look-ahead delta sigma modulator having maximum and minimum quantization levels that may result in feedback gain that is insufficient to provide stability of the loop filter. For example, for a one-bit look-ahead delta sigma modulator having respective maximum and minimum quantization levels of +1 and −1, quantizing a +2 quantizer input with +1 yields an effective feedback gain of 0.5. A relatively low feedback gain of 0.5 can cause the poles of the loop filter transfer function to move outside the unit circle in the z-domain in even modestly aggressive noise-shaping loop filters, thus causing the look-ahead delta sigma modulator to enter an unstable operational region.

Look-ahead delta sigma modulators can be alternatively viewed in the time domain. For a positive input signal, feedback in the look-ahead delta sigma modulator should drive the state variables of the loop filter towards lower values. Quantizer decisions are strongly biased to later state variables in the short term. In the long term (typically 30–50 input signal samples), the quantizer decisions are most strongly controlled by the earlier state variables. For non-look-ahead delta sigma modulators, the feedback to the loop filter attempts to drive the later state variables to lower values. Such a system can potentially create a situation where the early state variables cannot be satisfied in the long term. The quantizer overload and prevention system described herein allows a look-ahead delta sigma modulator to trade off some of the short term goals, such as low SNR, for long term goals such as delta sigma modulator stability. In effect, the look-ahead delta sigma modulator with overload prevention can anticipate quantizer overload and adjust the early state variables to trade off some SNR for stability.

Figure 4:
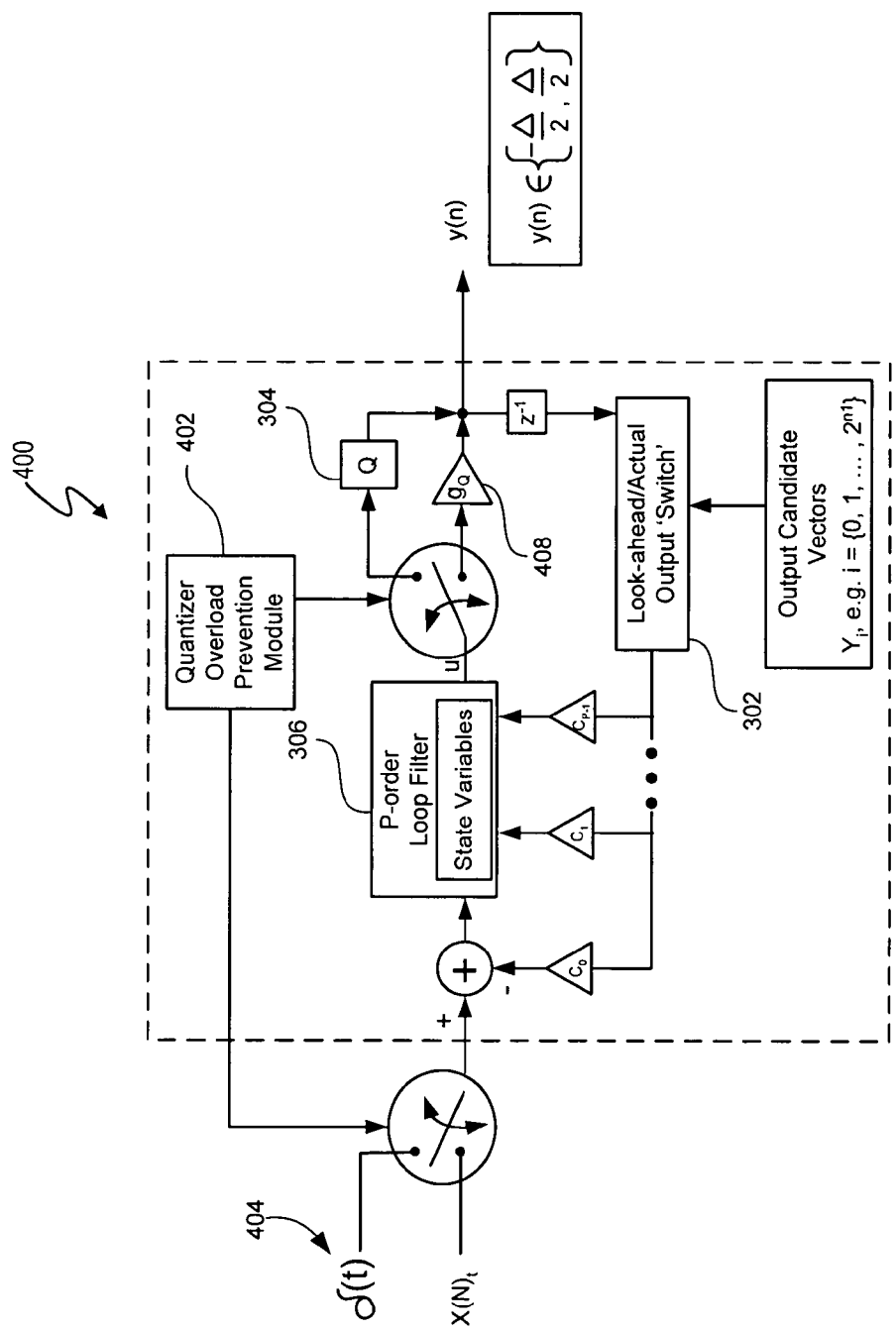
FIG. 4 depicts a look-ahead delta sigma modulator with quantizer overload prevention.

FIG. 4 depicts a look-ahead delta sigma modulator 400 with quantizer overload prevention module 402. The look-ahead delta sigma modulator 400 has normal look-ahead depth of n1. The MCLt corresponds directly with a minimum quantizer overload protection look-ahead depth of n2. The quantizer overload protection look-ahead depth n2 is used to anticipate and prevent quantizer overload. The quantizer overload protection look-ahead depth n2 can be determined from the natural, closed loop response of look-ahead delta sigma modulator 400 to an impulse function 404 when a gain stage 408 substitutes for the quantizer 306. In at least one embodiment, gain stage 408 is a constant gain equal to the gain of quantizer 406. In at least one embodiment the gain of quantizer 406 equals one (1).

Figure 5:
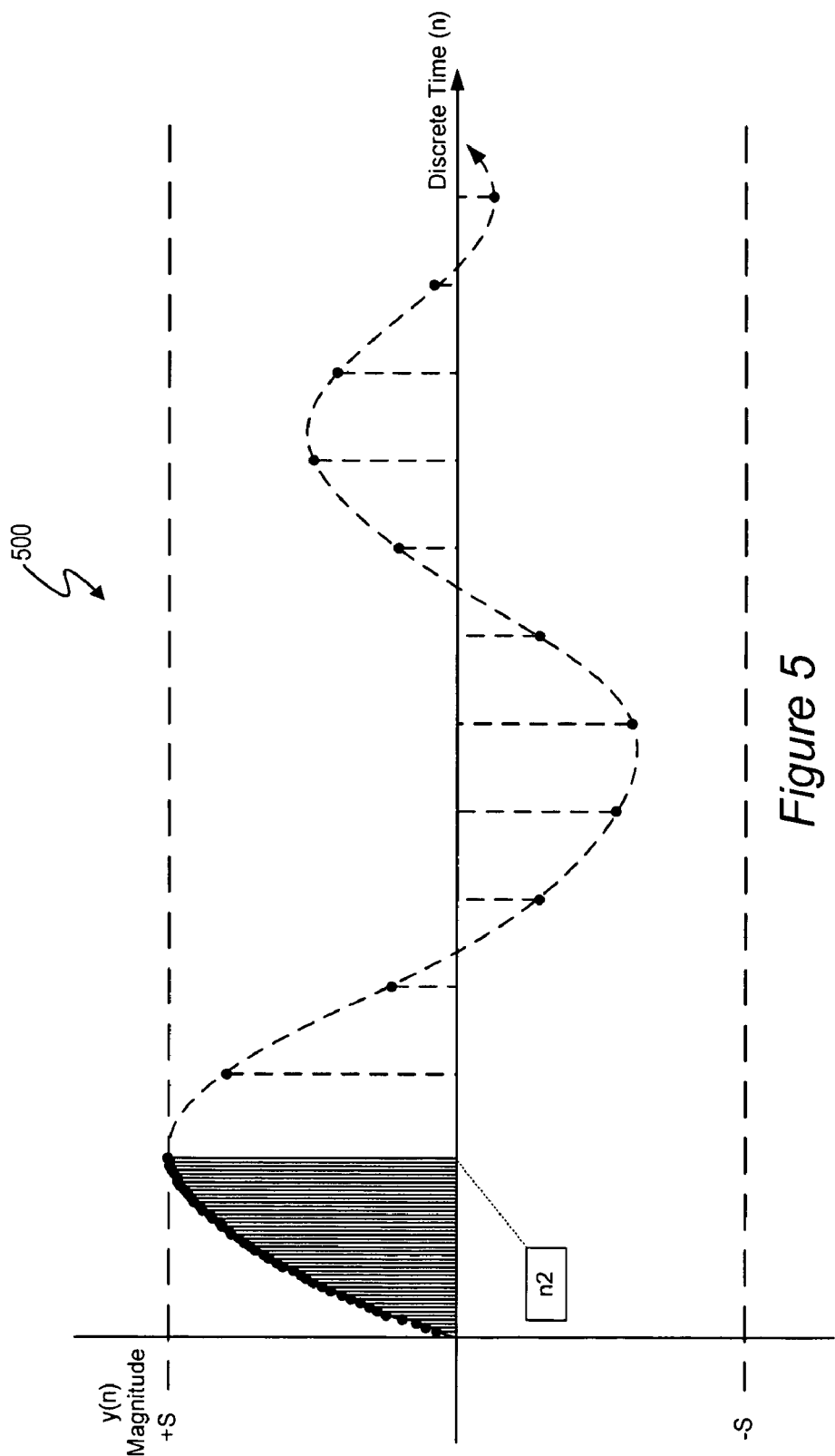
FIG. 5 depicts an impulse response of the look-ahead delta sigma modulator of FIG. 4.

FIG. 5 depicts an impulse response 500 of look-ahead delta sigma modulator 400 with gain stage 408 substituting for quantizer 406 and the state variables of P-order loop filter 306 set to an initial state. Each sample is depicted in the initial rise of the response and, for clarity, only representative samples are shown subsequently. The initial state depends on the actual implementation of the P-order loop filter 306. The initial state can be determined empirically by evaluating different initial state variable values and determining the greatest MCLt within an error range acceptable to the designer. The absolute value of the magnitude ("max (abs)") of the impulse response 500 is considered settled when max(abs(y(n)))≦S, where S is a maximum settling magnitude. Discrete time n2 represents the earliest discrete time when max(abs(y(n))≦S. In other words, max(abs(y(n2)) equals the settling time of impulse response 500 if max(abs(y(n2−k))≧S for 0≦k<n2 and max(abs(y(n2+k)) ≦S for n2<k<∞, where k represents a discrete time step. The MCLt generally represents a minimum value of quantizer overload protection look-ahead depth n2. Larger values of quantizer overload protection look-ahead depth n2 give greater confidence of quantizer overload protection but also generally require greater processing time. Values of quantizer overload protection look-ahead depth n2 smaller than MCLt generally require less processing time but also provide a lesser degree of confidence in achieving quantizer overload protection.

As previously stated, the discrete MCLt n2 also represents the amount of look-ahead depth capable of anticipating and preventing quantizer overload. The MCLt n2 is proportional to the inverse of the linear-linear scale slope of the NTF of P-order loop filter 306. Thus, the quantizer overload protection look-ahead depth n2 is dependent on the noise shaping gain of P-order loop filter 306, and the noise shaping gain of P-order loop filter 306 is, for example, dependent upon the order of P-order loop filter 306. Thus, in general, the value of look-ahead depth n2 is related to the value of P. The quantizer overload protection look-ahead depth n2 is typically in the range of 30–50 but can be more or less. Quantizer overload protection look-ahead depth n2 of 60–70 have been used for a $9^{th}$ order loop filter. Using a look-ahead depth of n2 effectively places more emphasis on the early state variables of P-order loop filter 306 and trades off some short term noise shaping goals. Trading off short term noise shaping goals slightly decreases the SNR of look-ahead delta sigma modulator 400.

Figure 6:
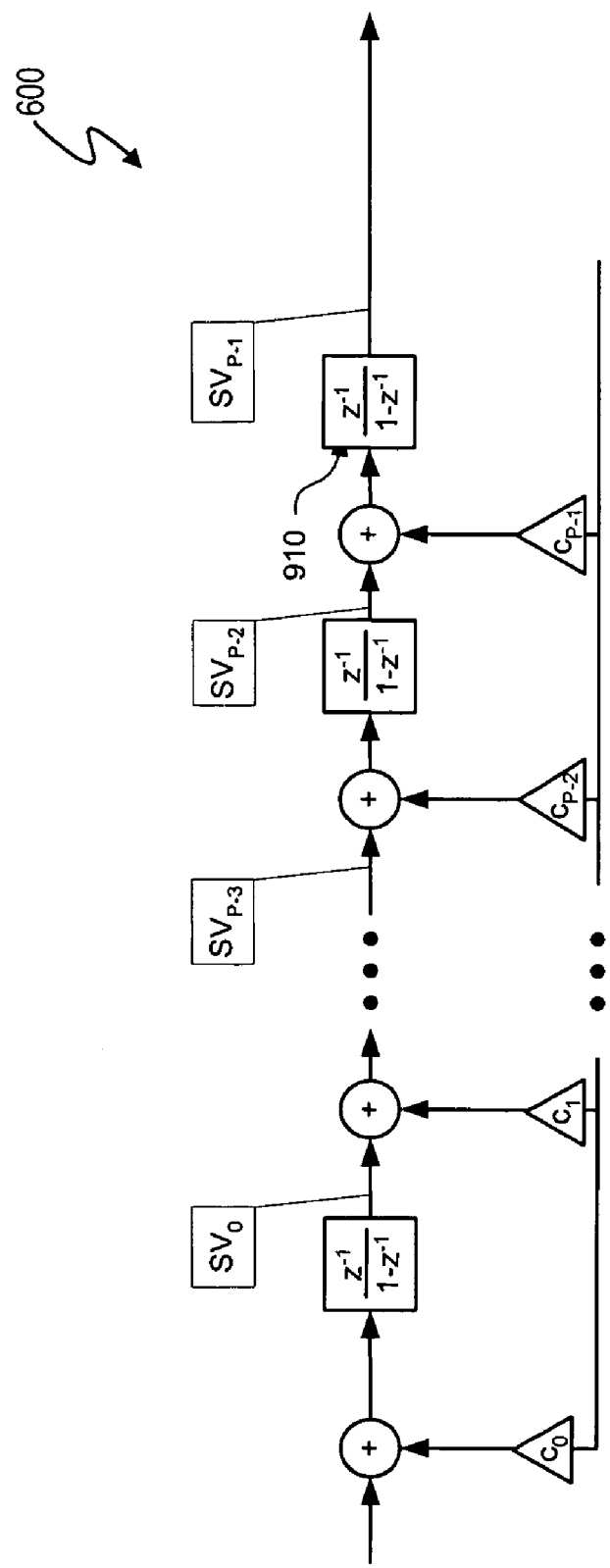
FIG. 6 depicts a loop filter for a look-ahead delta sigma modulator.
Figure 7:
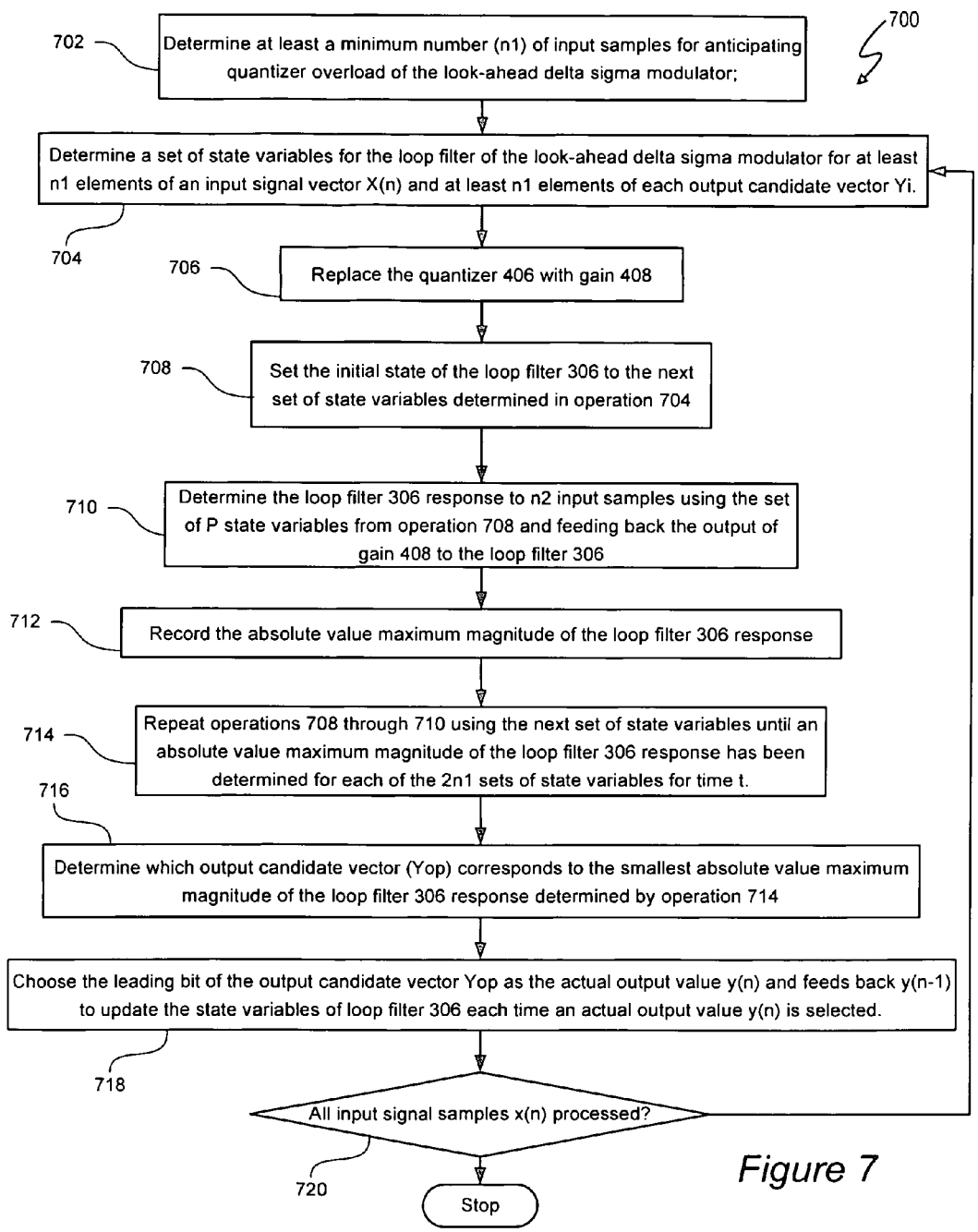
FIG. 7 depicts a quantizer overload prevention process.

FIG. 6 depicts P-order loop filter 600, which represents one embodiment of a P-order loop filter 306. Each state variable is represented by "$SV_x$" x={0, 1, . . . , P−1}, and each stage of the loop filter 600 is represented by an integrator with feedback from the output of the integrator to the immediately preceding summing node.

In one embodiment, quantizer overload prevention module 402 operates in accordance with exemplary quantizer overload prevention process 700. Operation 702 represents the initial setup that determines the quantizer overload protection look-ahead depth n2. In one embodiment of operation 702, the quantizer overload prevention module 402 applies an impulse function 404 to look-ahead delta sigma modulator 400 and determines the natural response of the look-ahead delta sigma modulator 400 by substituting the quantizer with gain stage 408 to modify look-ahead delta sigma modulator 400 (referred to herein as a "gain modified look-ahead delta sigma modulator 400"). With the state variables of loop filter 306 set to an initial state, as previously described, operation 702 determines the discrete settling time n2, which also represents the quantizer overload protection look-ahead depth, as discussed with reference to FIG. 5.

For each time t, operation 704 processes the input signal vector X(N) using each output candidate vector $Y_i$, i={0, 1, . . . , $2^{n1}$} as quantizer feedback. The following U.S. Patent Applications describe exemplary ways of determining the best match output candidate vector $Y_{bestm}$ and output value y(n): (i) U.S. patent Ser. No. 10/995,731, entitled "Look-Ahead Delta Sigma Modulator with Quantization Using Natural and Pattern Loop Filter", filed Nov. 22, 2004, inventor John L. Melanson (referred to herein as the "Melanson Patent"); (ii) U.S. patent Ser. No. 10/875,920, entitled "Signal Processing with a Look-Ahead Modulator Having Time Weighted Error Values", filed Jun. 24, 2004, inventor John L. Melanson; (iii) U.S. patent Ser. No. 10/900,877, entitled "Signal Processing with Look-Ahead Modulator Noise Quantization Minimization", filed Jul. 29, 2004, inventor John L. Melanson; (iv) U.S. patent Ser. No. 11/035,288, entitled "Jointly Non-Linear Delta Sigma Modulators", filed Jan. 13, 2005, inventor John L. Melanson; (v) U.S. patent Ser. No. 11/037,311, entitled "Look-Ahead Delta Sigma Modulator Having an Infinite Impulse Response Filter with Multiple Look-Ahead Outputs", filed Jan. 18, 2005, inventor John L. Melanson; (vi) U.S. patent Ser. No. 11/043,719, entitled "Look-Ahead Delta Sigma Modulator with Pruning of Output Candidate Vectors Using Quantization Error Minimization Pruning Techniques", filed Jan. 26, 2005, inventor John L. Melanson; (vii) U.S. patent Ser. No. 11/043,720, entitled "Pattern Biasing for Look-Ahead Delta-Sigma Modulators", filed Jan. 26, 2005, inventor John L. Melanson; (viii) and U.S. patent Ser. No. 11/037,316, entitled "Look-Ahead Delta Sigma Modulators with Quantizer Input Approximations", filed Jan. 18, 2005, inventor John L. Melanson, all of which are incorporated herein by reference in their entirety.

Figure 8:
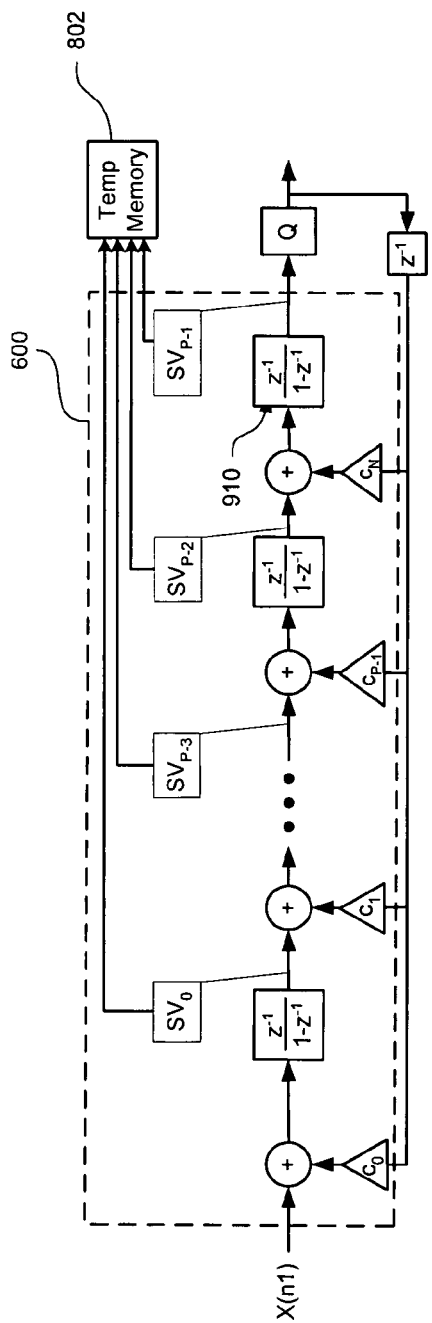
FIG. 8 depicts a look-ahead delta sigma modulator and temporary storage for state variables.

The P-order loop filter will have $2^{n1}$ sets of P state variables, one set for each of the $2^{n1}$ combinations of input signal vector X(N) and output candidate vectors Y. Each set of state variables of loop filter 600 is saved in a temporary memory 802 as depicted in FIG. 8.

Figure 9:
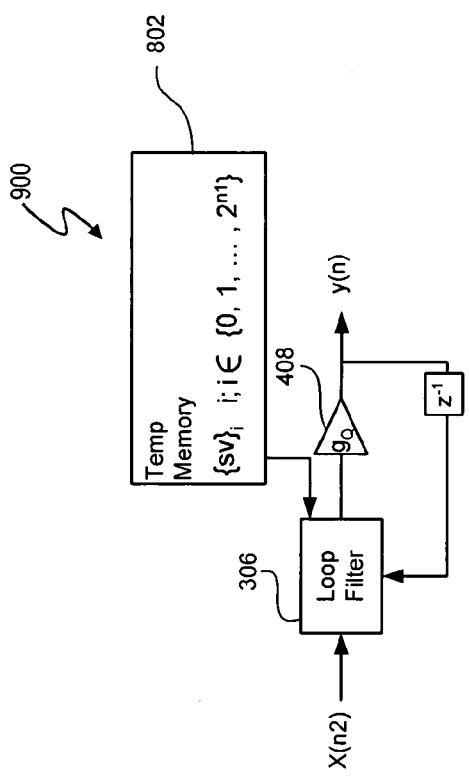
FIG. 9 depicts a look-ahead delta sigma modulator in a state to determine overload protection output candidate vectors.

Operation 706 substitutes gain stage 408 for the quantizer 406. Look-ahead delta sigma modulator 900 depicted in FIG. 9 represents look-ahead delta sigma modulator 400 in the state of determining overload prevention output candidate vectors for each set of $2^{n1}$ state variables. Operation 708 then sets the initial state of the loop filter 306 to the first set of state variables determined in operation 704. Operation 710 then determines the response of gain modified look-ahead delta sigma modulator 400 to n2 input samples using the first set of P state variables and feeding back the output of gain stage 408 to the loop filter 306. Operation 712 records the MCL of the gain modified look-ahead delta sigma modulator 400 to the n2 input samples. Operation 714 then repeats operations 708 through 710 using the next set of state variables until an MCL of gain modified look-ahead delta sigma modulator 400 has been determined for each of the $2^{n1}$ sets of state variables for time t.

Operation 716 determines which output candidate vector Y corresponds to the smallest MCL of the gain modified look-ahead delta sigma modulator 400 response determined by operation 714. The output candidate vector corresponding to the smallest MCL is referred to as overload prevention output candidate vector $Y_{op}$. Operation 718 chooses the leading bit of the output candidate vector $Y_{op}$ as the actual output value y(n) and feeds back y(n)$z^{-1}$ (i.e. y(n) delayed by one time step) to update the state variables of loop filter 306 each time an actual output value y(n) is selected. Operation 720 then causes the quantizer overload prevention process 700 to return to operation 704 until all input samples x(n) have been processed by look-ahead delta sigma modulator 400.

In general quantizer overload protection is not needed for every input signal sample x(n) because every input signal sample x(n) will not cause quantizer overload. Thus, in another embodiment of quantizer overload prevention process 700, initially quantizer overload prevention process 700 determines the MCL only for the best match output candidate vector $Y_{bestm}$. If the MCL of the best match output candidate vector $Y_{bestm}$ exceeds a predetermined overload prevention threshold, then quantizer overload prevention process 700 starts at operation 704 to choose the leading bit of the overload prevention output candidate vector $Y_{op}$ as the actual output value y(n). Otherwise, operation 718 chooses the leading bit of the best match output candidate vector $Y_{bestm}$ as the actual output value y(n).

In one embodiment, the predetermined overload prevention threshold is 0.75 times the quantizer step size Δ, e.g. for a one-bit quantizer and y(n)={+1, −1}, and the overload prevention threshold is 0.75*2=1.5. This combination of choosing the actual output value y(n) from the best match output candidate vector $Y_{bestm}$ when quantizer overload prevention is not needed and choosing the actual output value y(n) from the overload prevention output candidate vector $Y_{op}$ when quantizer overload prevention is needed provides the best look-ahead delta sigma modulator behavior for high SNR for low level input signals and quantizer overload protection.

Additionally, in general, the impulse response of the look-ahead delta sigma modulator 400 is slow to change relative to the oversampling rate of the input signal to the look-ahead delta sigma modulator 400. Thus, in another embodiment, quantizer overload prevention process 700 is performed only for every r input signal vectors X(N), where r is a value determined by design choice that will be sufficient to prevent quantizer overload and provide better performance for look-ahead delta sigma modulator 400. In one embodiment r equals 2, 3, or 4.

In another embodiment of quantizer overload prevention process 700, only a subset of the complete set of $2^{n1}$ are used to determine best match output candidate vector $Y_{bestm}$ and overload prevention output candidate vector $Y_{op}$. In one embodiment, the natural and pattern responses of look-ahead delta sigma modulator 400 are used as described in the Melanson Patent to reduce the number of output candidate vectors used to determine best match output candidate vector $Y_{bestm}$ and overload prevention output candidate vector $Y_{op}$.

In another embodiment of quantizer overload prevention process 700, quantizer overload prevention module 402 performs the quantizer overload prevention process 700 once for every T samples. In at least one embodiment, T represents a number of input samples whose values remain relatively close. The impulse response of the gain modified look-ahead delta sigma modulator 400 is a function of the state variables of loop filter 306 and the input signal sample values. The input signal sample values generally vary slowly over a sampling period of T samples. Thus, quantizer overload prevention module 402 can perform the quantizer overload prevention process 700 using a subset of one or more input signal samples a group of T input samples. The subset can be, for example, one input sample selected from the group of T input samples or an average of 2 or more input samples from the group of T input samples. The quantizer overload prevention process 700 can then use a subset of input signal samples to anticipate quantizer overload for the entire group of T input signal samples.

The combination of choosing the actual output value y(n) from the best match output candidate vector $Y_{bestm}$ when quantizer overload prevention is not needed and choosing the actual output value y(n) from the overload prevention output candidate vector $Y_{op}$ when quantizer overload prevention is needed provides the best look-ahead delta sigma modulator behavior for high SNR for low level input signals and quantizer overload protection.

Figure 10:
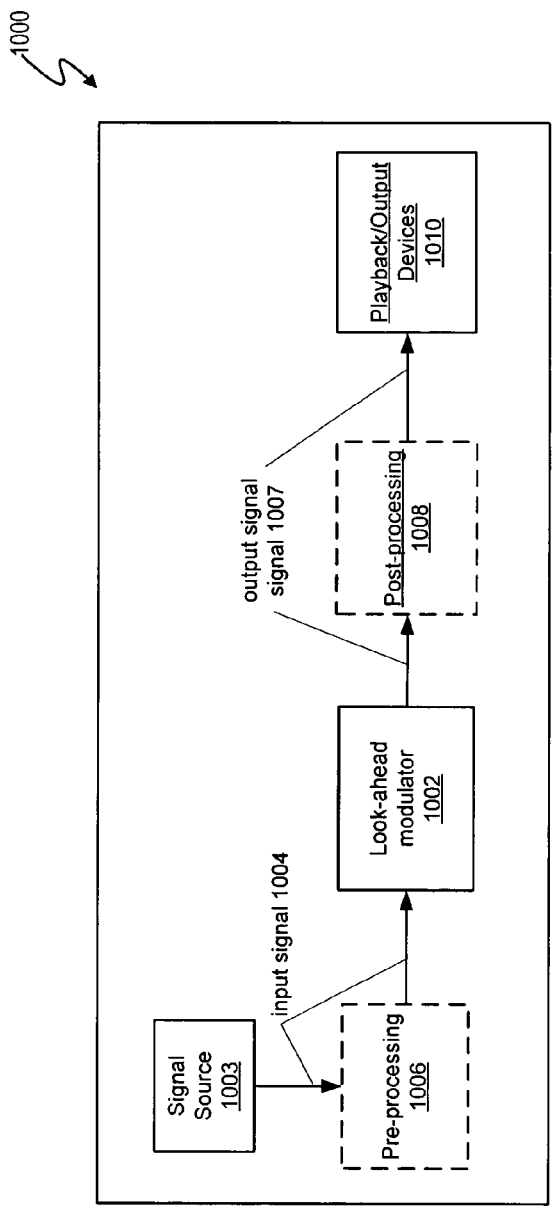
FIG. 10 depicts an exemplary signal processing system that includes a look-ahead modulator, an output device and process, and an output medium.

Referring to FIG. 10, signal processing system 1000 depicts one embodiment of a signal processing system that includes delta sigma modulator 1002. Look-ahead delta sigma modulator 1002 represents an embodiment of look-ahead delta sigma modulator 400. Signal processing system 1000 is particularly useful for high-end audio applications such as super audio compact disk ("SACD") recording applications. Signal processing system 1000 processes an input signal 1004 generated by an input signal source 1003. The input signal 1004 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1004 may be an audio signal, a video signal, an audio plus video signal, and/or other signal type. Generally, input signal 1004 undergoes some preprocessing 1006 prior to being modulated by delta sigma modulator 1002. For example, pre-processing 1006 can involve an interpolation filter to oversample a digital input signal 1004 in a well-known manner. Pre-processing 1006 can include an analog-to-digital converter to convert an analog input signal 1004 into a digital signal. Pre-processing 1006 can also include mixing, reverberation, equalization, editing, out-of-band noise filtering and other filtering operations.

In the digital domain, pre-processing 1006 provides discrete input signals x[n] to look-ahead delta sigma modulator 1002. Each discrete input signal x[n] is an N-bit signal, where N is greater than one. As previously described in more detail, look-ahead delta sigma modulator 1002 processes M input signals x[n] and patterns of M output candidates y[n] to determine an output signal 1007 from the output candidates corresponding to each input signal x[n]. Output signal 1007 is, for example, a collection of one-bit output values. The output signal 1007, thus, becomes an encoded version of the input signal 1004.

Figure 11:
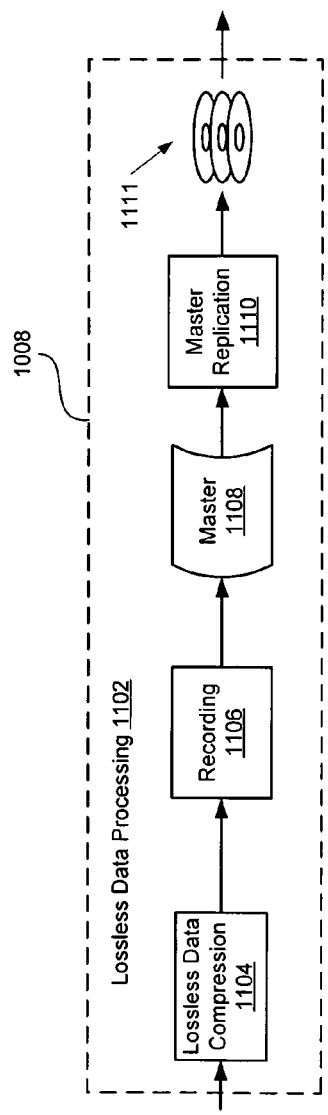
FIG. 11 depicts exemplary post-processing operations in an embodiment of the signal processing system of FIG. 10.

Referring to FIGS. 10 and 11, signal processing system 1000 typically includes post-processing 1008 to post-process the output signal 1007 of look-ahead modulator 1002. Post-processing 1008 can include lossless data processing 1102. For SACD audio mastering, there is a lossless data compression stage 1104, followed by a recording process 1106 that produces the actual pits that are burned into a master storage medium 1108. The master storage medium 1108 is then mechanically replicated to make the disks (or other storage media) 1112 available for widespread distribution. Disks 1112 are, for example, any variety of digital versatile disk, a compact disk, tape, or super audio compact disk. Playback/output devices 1010 read the data from the disks 1112 and provide a signal output in a format perceptible to users. Playback/output devices 1010 can be any output devices capable of utilizing the output signal 1007. Thus, the storage media 1108 and 1112 include data encoded using signal modulation processes achieved using look-ahead delta sigma modulator 1002.

The signal processing systems disclosed herein can be manufactured using well-known integrated, discrete, or a combination of integrated and discrete components. Additionally, software in combination with a processor can be used to implement features of the signal processing systems, such as a notch filter. Those of ordinary skill in the art will recognize that the signal processing systems disclosed herein can be implemented with a wide range of components other than those disclosed herein. For example, the digital signal modulators could be implemented using mixed signal (analog and digital) technology.

Although the present invention has been described in detail, it should be understood that various changes, substitutions and alterations can be made hereto without departing from the spirit and scope of the invention as defined by the appended claims.

What is claimed is:

1. A method of anticipating quantizer overload of a look-ahead delta sigma modulator, the method comprising:
determining a likelihood of quantizer overload of the look-ahead delta sigma modulator from a closed loop response of the look-ahead delta-sigma modulator to a closed loop feedback signal, wherein the look-ahead delta-sigma modulator includes a gain stage substitute for a quantizer, wherein the look-ahead delta sigma modulator has a look-ahead depth of n1 and n1 is a positive integer greater than one.

2. The method of claim 1 further comprising:
substituting a quantizer of the look-ahead delta sigma modulator with the gain stage having a constant gain.

3. The method of claim 1 wherein a look-ahead depth of the look-ahead delta sigma modulator equals n1, the method further comprising:
determining a number, n2, of input samples to anticipate quantizer overload of the look-ahead delta sigma modulator, wherein n2 is an integer;
determining a set of state variables for the loop filter of the look-ahead delta sigma modulator for at least n1 elements of an input signal vector X(n) and at least n1 elements of each output candidate vector $Y(n)_i$, wherein "i" is an element of at least a subset of the set $\{0, 1, \ldots, 2^{n1-1}\}$ and the n1 elements of input signal vector X(n) represent n1 input signal samples;
substituting a quantizer of the look-ahead delta sigma modulator with a gain stage to provide a closed loop feedback path in the look-ahead delta sigma modulator;
determining closed loop output responses of the look-ahead delta sigma modulator for n2 input samples using at least one set of determined state variables;
determining which closed loop output response has a lowest maximum absolute value closed loop filter output response; and
if overload of the look-ahead delta-sigma modulator is anticipated, selecting an output of the look-ahead delta sigma modulator from the output candidate vector corresponding to the determined closed loop output response having the lowest maximum absolute value closed loop look-ahead delta sigma modulator response.

4. A signal processing system comprising a look-ahead delta-sigma modulator with overload protection, the look-ahead delta-sigma modulator comprising:
an overload protection module to determine a likelihood of quantizer overload of the look-ahead delta sigma modulator from a closed loop response of the look-ahead delta-sigma modulator to a closed loop feedback signal, wherein the look-ahead delta-sigma modulator includes a gain stage substitute for a quantizer, wherein the look-ahead delta sigma modulator has a look-ahead depth of n1 and n1 is a positive integer greater than one.

5. The signal processing system of claim 4 wherein the look-ahead delta-sigma modulator further comprises:
an input to receive an input signal vector X(n), wherein the input signal vector X(n) has n1 elements;
a loop filter coupled to the input;
a quantizer coupled to the loop filter;
a gain module coupled to the loop filter; and
a memory to store a set of state variables for the loop filter of the look-ahead delta sigma modulator for at least n1 elements of an input signal vector X(n) and at least n1 elements of each output candidate vector $Y(n)_i$, wherein "i" is an element of at least a subset of the set $\{0, 1, \ldots, 2^{n1-1}\}$, n1 is a positive integer greater than one, and the n1 elements of input signal vector X(n) represent n1 input signal samples;
wherein the overload protection module is configured to:
substitute the quantizer with the gain stage to provide a closed loop feedback path in the look-ahead delta sigma modulator;
determine closed loop output responses of the look-ahead delta sigma modulator for n2 input samples using at least one set of determined state variables, wherein n2 represents a number of input samples to anticipate overload of the quantizer;
determine which closed loop output response has a lowest maximum absolute value closed loop output response; and
if overload of the look-ahead delta-sigma modulator is anticipated, select an output of the look-ahead delta sigma modulator from the output candidate vector corresponding to the determined closed loop output response having the lowest maximum absolute value closed loop output response.

6. A method of quantizing an input signal using a look-ahead delta-sigma modulator having quantizer overload protection, wherein a look-ahead depth of the look-ahead delta sigma modulator equals n1, the method comprising:
determining a set of state variables for a loop filter of the look-ahead delta sigma modulator for at least n1 elements of an input signal vector X(n) and at least n1 elements of each output candidate vector $Y(n)_i$, wherein "i" is an element of at least a subset of the set $\{0, 1, \ldots, 2^{n1-1}\}$, n1 is a positive integer greater than one, and the n1 elements of input signal vector X(n) represent n1 input signal samples;
substituting a quantizer of the look-ahead delta sigma modulator with a gain stage to provide a closed loop feedback path in the look-ahead delta sigma modulator;
determining closed loop output responses of the look-ahead delta sigma modulator for n2 input samples using at least one set of determined state variables, wherein n2 represents a number of input samples to anticipate quantizer overload of the look-ahead delta sigma modulator;
determining which closed loop output response has a lowest maximum absolute value closed loop output response; and
if overload of the look-ahead delta-sigma modulator is anticipated, selecting an output of the look-ahead delta sigma modulator from the output candidate vector corresponding to the determined closed loop output response having the lowest maximum absolute value closed loop output response.

7. The method of claim 6 further comprising:
determining the number n2 of input samples to anticipate quantizer overload of the look-ahead delta sigma modulator.

8. The method of claim 7 wherein determining the number n2 of input samples to anticipate quantizer overload of the look-ahead delta sigma modulator comprises determining a minimum discrete time to achieve an absolute value maximum closed loop response magnitude of the look-ahead delta-sigma modulator.

9. The method of claim 6 wherein selecting an output of the look-ahead delta sigma modulator from the output candidate vector corresponding to the determined closed loop output response having the lowest maximum absolute value closed loop output response further comprises selecting a leading bit from the output candidate vector corresponding to the determined closed loop output response having a lowest maximum absolute loop filter output value as an output of the look-ahead delta sigma modulator.

10. The method of claim 6 further comprising:
updating actual state variables using the selected output of the look-ahead delta-sigma modulator as feedback for the loop filter of the look-ahead delta-sigma modulator.

11. The method of claim 6 further comprising:
determining if overload of the look-ahead delta-sigma modulator is anticipated, wherein determining if overload of the look-ahead delta-sigma modulator is anticipated comprises:
determining if the lowest maximum absolute closed loop filter output value exceeds a predetermined value.

12. The method of claim 11 wherein the predetermined value equals 0.75 times a step size of the quantizer of the look-ahead delta-sigma modulator.

13. The method of claim 6 wherein determining a set of state variables for a loop filter of the look-ahead delta sigma modulator further comprises:
determining a set of state variables for the loop filter of the look-ahead delta sigma modulator for at least n1 elements of the input signal vector X(n) and at least n1 elements of each output candidate vector $Y(n)_1$.

14. The method of claim 6 further comprising:
determining a best match between an output candidate vector and the input signal vector X(n); and
if overload of the look-ahead delta-sigma modulator is not anticipated, selecting an output of the look-ahead delta sigma modulator from the output candidate vector that best matches the input signal vector X(n).

15. The method of claim 6 wherein determining closed loop output responses of the look-ahead delta sigma modulator for n2 input samples using at least one set of determined state variables comprises determining closed loop output responses of the look-ahead delta sigma modulator for n2 input samples using a set of determined state variables from the output candidate vector Y(n) that best matches the input signal vector X(n).

16. The method of claim 6 wherein the at least one set of determined state variables comprises state variables determined from one or more input samples in a subset of a group of T input samples, wherein T is an integer greater than or equal to two.

17. The method of claim 16 wherein the one or more input samples in the subset of a group of T input samples subset represents an average of at least a subset of the T input samples.

18. The method of claim 6 wherein the input signal vector X(n) represents input data derived from audio input signal data.

19. The method of claim 6 further comprising:
recording quantized quantizer input signal data on storage media.

20. A signal processing system to quantize an input signal using a look-ahead delta-sigma modulator with quantizer overload protection module, wherein a look-ahead depth of the look-ahead delta sigma modulator equals n1, the signal processing system comprising:
an input to receive an input signal vector X(n), wherein the input signal vector X(n) has n1 elements and n1 is a positive integer greater than one and equals a look-ahead depth of the look-ahead delta-sigma modulator;
a loop filter coupled to the input;
a quantizer coupled to the loop filter;
a gain stage coupled to the loop filter; and
a memory to store a set of state variables for the loop filter of the look-ahead delta sigma modulator for at least n1 elements of an input signal vector X(n) and at least n1 elements of each output candidate vector $Y(n)_i$, wherein "i" is an element of at least a subset of the set $\{0, 1, \ldots, 2^{n1-1}\}$, n1 is a positive integer greater than one, and the n1 elements of input signal vector X(n) represent n1 input signal samples;
wherein the overload protection module is configured to:
substitute the quantizer with the gain stage to provide a closed loop feedback path in the look-ahead delta sigma modulator;
determine closed loop output responses of the look-ahead delta sigma modulator for n2 input samples using at least one set of determined state variables, wherein n2 represents a number of input samples to anticipate overload of the quantizer;
determine which closed loop output response has a lowest maximum absolute value closed loop output response; and
if overload of the look-ahead delta-sigma modulator is anticipated, select an output of the look-ahead delta sigma modulator from the output candidate vector corresponding to the determined closed loop output response having the lowest maximum absolute value closed loop output response.

21. The signal processing system of claim 20 wherein the number n2 of input samples to anticipate quantizer overload of the look-ahead delta sigma is at least equal to a discrete time to achieve an absolute value maximum closed loop response magnitude of the look-ahead delta-sigma modulator.

22. The signal processing system of claim 20 wherein the overload protection module is further configured to select a leading bit from the output candidate vector corresponding to the determined closed loop output response having a lowest maximum absolute loop filter output value as an output of the look-ahead delta sigma modulator.

23. The signal processing system of claim 20 wherein the overload protection module is further configured to:
update actual state variables using the selected output of the look-ahead delta-sigma modulator as feedback for the loop filter of the look-ahead delta-sigma modulator.

24. The signal processing system of claim 20 wherein the overload protection module is further configured to:
determine if overload of the look-ahead delta-sigma modulator is anticipated, wherein to determine if overload of the look-ahead delta-sigma modulator is anticipated comprises:
determining if the lowest maximum absolute closed loop filter output value exceeds a predetermined value.

25. The signal processing system of claim 24 wherein the predetermined value equals 0.75 times a step size of the quantizer of the look-ahead delta-sigma modulator.

26. The signal processing system of claim 20 wherein the overload protection module is further configured to:
determining a set of state variables for the loop filter of the look-ahead delta sigma modulator for at least n1 elements of the input signal vector X(n) and at least n1 elements of each output candidate vector $Y(n)_1$.

27. The signal processing system of claim 20 further comprising:
 signal processing and recording equipment to process output data from the quantizer and record the processed output data on storage media.

28. The signal processing system of claim 20 wherein the input signal vector X(n) represents input data derived from audio input signal data.

29. The signal processing system of claim 20 wherein the quantizer is configured to determine a best match between an output candidate vector and the input signal vector X(n) and, if overload of the look-ahead delta-sigma modulator is not anticipated, the quantizer is further configured to select an output of the look-ahead delta sigma modulator from the output candidate vector that best matches the input signal vector X(n).

30. The signal processing system of claim 20 wherein the at least one set of determined state variables comprises state variables determined from one or more input samples in a subset of a group of T input samples, wherein T is an integer greater than or equal to two.

31. The signal processing system of claim 30 wherein the one or more input samples in the subset of a group of T input samples subset represents an average of at least a subset of the T input samples.

32. An apparatus to quantize an input signal using a look-ahead delta-sigma modulator with quantizer overload protection, wherein a look-ahead depth of the look-ahead delta sigma modulator equals n1, the apparatus comprising:
 means for determining a set of state variables for a loop filter of the look-ahead delta sigma modulator for at least n1 elements of an input signal vector X(n) and at least n1 elements of each output candidate vector $Y(n)_i$, wherein "i" is an element of at least a subset of the set $\{0, 1, \ldots, 2^{n1-1}\}$, n1 is a positive integer greater than one, and the n1 elements of input signal vector X(n) represent n1 input signal samples;
 means for substituting a quantizer of the look-ahead delta sigma modulator with a gain stage to provide a closed loop feedback path in the look-ahead delta sigma modulator;
 means for determining closed loop output responses of the look-ahead delta-sigma modulator for n2 input samples using at least one set of determined state variables, wherein n2 represents a number of input samples to anticipate quantizer overload of the look-ahead delta sigma modulator;
 means for determining which closed loop output response has a lowest maximum absolute value closed loop output response; and
 means for selecting an output of the look-ahead delta sigma modulator from the output candidate vector corresponding to the determined closed loop output response having the lowest maximum absolute value closed loop output response if overload of the look-ahead delta-sigma modulator is anticipated.

33. A method comprising:
 substituting a gain stage for a quantizer in a look-ahead delta sigma modulator, wherein the look-ahead delta sigma modulator has a look-ahead depth of n1 and n1 is a positive integer greater than one;
 providing a first input signal to the gain stage;
 determining a feedback signal from the gain stage;
 providing the feedback signal to a loop filter of the look-ahead delta sigma modulator;
 providing a second input signal to the loop filter;
 determining an output of the loop filter from a combination of the input signal and the feedback signal;
 substituting the quantizer for the gain stage in the look-ahead delta sigma modulator; and
 selecting a quantization output using the loop filter.

34. The method of claim 33 wherein substituting a gain state further comprises substituting a gain stage having a constant gain.

35. The method of claim 33 wherein providing a second input signal further comprises providing an audio input signal to the loop filter of the look-ahead delta sigma modulator.

36. The method of claim 33 further comprising:
 recording the quantization output on storage media.

37. A signal processing system comprising:
 a look-ahead delta sigma modulator, wherein the look-ahead delta sigma modulator has a look-ahead depth of n1 and n1 is a positive integer greater than one, the look-ahead delta sigma modulator comprising:
 a loop filter to filter a combination of an input signal and a feedback signal;
 a quantizer coupled to an output of the loop filter to select a quantization output using an output of the loop filter;
 a gain stage coupled to the output of the loop filter to generate the feedback signal; and
 a module to substitute the gain stage for the quantizer to allow the gain stage to receive an output signal from the loop filter and generate the feedback signal for the loop filter.

38. The signal processing system of claim 37 wherein the gain stage has a constant gain.

39. The signal processing system of claim 37 wherein the input signal is an audio input signal.

40. The signal processing system of claim 37 further comprising:
 signal processing and recording equipment to process output data from the quantizer and record the processed output data on storage media.

* * * * *